(12) United States Patent
Park et al.

(10) Patent No.: US 10,811,311 B2
(45) Date of Patent: Oct. 20, 2020

(54) ELEMENT ISOLATION LAYER STRUCTURE AND METHOD OF MANUFACTURING THE SAME

(71) Applicant: DB HITEK CO., LTD., Seoul (KR)

(72) Inventors: Dong Hoon Park, Uiwang-si (KR); Jung Hyun Lee, Yeoju-si (KR); Dae Il Kim, Cheongju-si (KR); Bum Seok Kim, Seoul (KR); Jin Hyo Jung, Suwon-si (KR); Seung Ha Lee, Hwaseong-si (KR); Sang Yong Lee, Chungju-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/244,656

(22) Filed: Jan. 10, 2019

(65) Prior Publication Data

US 2019/0221476 A1    Jul. 18, 2019

(30) Foreign Application Priority Data

Jan. 10, 2018 (KR) .......................... 10-2018-0003123

(51) Int. Cl.
*H01L 21/768* (2006.01)
*H01L 29/06* (2006.01)
*H01L 21/762* (2006.01)

(52) U.S. Cl.
CPC ...... *H01L 21/76832* (2013.01); *H01L 21/762* (2013.01); *H01L 21/76224* (2013.01); *H01L 21/76816* (2013.01); *H01L 21/76831* (2013.01); *H01L 21/76837* (2013.01); *H01L 29/0649* (2013.01)

(58) Field of Classification Search
CPC ..................... H01L 29/0649; H01L 21/76832
See application file for complete search history.

(56) References Cited

U.S. PATENT DOCUMENTS

| 6,531,377 | B2 * | 3/2003 | Knorr | H01L 21/76229 |
| | | | | 257/E21.548 |
| 7,199,022 | B2 * | 4/2007 | Yasui | H01L 21/76224 |
| | | | | 257/E21.546 |
| 2002/0072198 | A1 * | 6/2002 | Ahn | H01L 21/76224 |
| | | | | 438/424 |
| 2003/0176151 | A1 * | 9/2003 | Tam | B24B 37/0056 |
| | | | | 451/41 |

(Continued)

*Primary Examiner* — Eugene Lee
(74) *Attorney, Agent, or Firm* — Patterson Thuente Pedersen, P.A.

(57) ABSTRACT

An element isolation structure includes a substrate defining a trench including an upper trench and a lower trench in communication with each other, the substrate including an inclined sidewall that forms the upper and lower trench; a first thin film liner on the substrate and conforming to the substrate, the first thin film liner having a substantially uniform thickness trench; a second thin film liner pattern selectively on a lower portion of the first thin film liner within a volume defined by the lower trench, the second thin film liner pattern having a substantially uniform thickness; a lower isolation layer formed on the second thin film liner pattern and substantially filling the volume defined by the lower trench; and an upper isolation layer formed on an upper portion of the first thin film liner and the lower isolation layer and substantially filling a volume defined by the upper trench.

4 Claims, 3 Drawing Sheets

(56) References Cited

U.S. PATENT DOCUMENTS

| | | | |
|---|---|---|---|
| 2005/0194646 A1* | 9/2005 | Inoue | H01L 21/31053 257/374 |
| 2007/0218645 A1* | 9/2007 | Zhou | H01L 21/76229 438/427 |
| 2009/0068817 A1* | 3/2009 | Eun | H01L 21/76232 438/425 |
| 2013/0171824 A1* | 7/2013 | Li | B24B 37/044 438/693 |
| 2015/0001669 A1* | 1/2015 | Chou | H01L 21/76224 257/506 |
| 2016/0336217 A1* | 11/2016 | Chang | H01L 21/02337 |

* cited by examiner

ELEMENT ISOLATION LAYER STRUCTURE AND METHOD OF MANUFACTURING THE SAME

CROSS-REFERENCE TO RELATED APPLICATION

This application claims priority to Korean Patent Application No. 10-2018-0003123, filed on Jan. 10, 2018 and all the benefits accruing therefrom under 35 U.S.C. § 119, the contents of which are incorporated by reference in their entirety.

TECHNICAL FIELD

The present disclosure relates to an element isolation layer structure for a semiconductor device and a method of manufacturing the same.

BACKGROUND

Various semiconductor elements included in a semiconductor device including, for example, transistors, capacitors, wiring, and the like should be formed in a small space in close proximity to other elements in order to obtain a high degree of integration in the semiconductor device. However, as the distance between such semiconductor elements in the semiconductor device is reduced, it may be necessary to electrically insulate the semiconductor elements from one another. As means for electrically isolating semiconductor elements from each other according to a conventional semiconductor device, a local oxidation Silicon (LOCOS) type field oxide layer and a trench type filed oxide layer have been widely used. In particular, a shallow trench-type element isolation layer (hereinafter, referred as "STI layer") has been widely utilized.

The STI layer may be formed by a technology for forming a trench for dividing a semiconductor substrate into an active region and a field region, and filling the trench with an insulating material to form an element isolation layer.

However, in the case when an STI layer has a CD (Critical Dimension) equal to or less than 0.25 μM in order to achieve a high integration degree of semiconductor devices, it is not easy to fill the trench with the STI layer.

Previously, an LPCVD (Low-pressure chemical vapor deposition) process or PECVD (Plasma Enhanced Chemical Vapor Deposition) process had been widely performed for filling the trench. However, sizes of semiconductor elements have become too small for use of this process on modern devices, and the active region becomes smaller as the degree of integration increases. High density plasma chemical vapor deposition (HDP CVD) process has therefore been carried out to fill the trench with HDP oxide to form the element isolation layer.

However, after the element isolation layer is formed, subsequent processes such as the oxidation process, the densification process, and the annealing process may be required to be further performed. While performing the subsequent processes, thermal stress may occur in the element isolation layer. Particularly, as a dislocation occurs in a core region defined between sidewall portion and bottom portion of the trench, an unacceptable leakage current may occur in the core region.

SUMMARY

The example embodiments of the present disclosure relate to an element isolation layer structure for a semiconductor device, and methods of forming the same, that is configured to divide a substrate of the semiconductor device into a plurality of regions and filled trenches that exhibits a relatively high aspect ratio. In some examples, the disclosure describes an element isolation layer structure capable of mitigating thermal stress (e.g., stress generated due to thermal expansion) in a core region of a trench to suppress separation from occurring in the core region.

In some examples, the disclosure describes a method of manufacturing an element isolation layer structure capable of suppressing the occurrence of separation by mitigating thermal stress in a core region of a trench.

In some examples, the disclosure describes an element isolation layer structure includes a substrate having an upper trench and a lower trench in communication with each other and each having an inclined sidewall, a first thin film liner conformally formed on the substrate to have a uniform thickness along the upper trench and the lower trench, a second thin film liner pattern selectively formed on a lower portion of the first thin film liner, the lower portion being located on both a bottom and a sidewall of the lower trench, the second thin film liner pattern having a uniform thickness to alleviate stress which occurs in a lower corner area of the lower trench, a lower isolation layer formed on the second thin film liner pattern to fill the lower trench and an upper isolation layer formed on an upper portion of the first thin film liner to fill the upper trench, the upper isolation layer being connected to the lower isolation layer.

In some examples, the first thin film liner includes an oxide, and the second thin film liner pattern includes a nitride. For example, the first thin film liner may include amino acid oxide, and the second thin film liner pattern may include amino acid nitride.

In an example embodiment, the upper trench has a vertical depth ratio ranging from about 1:0.5 to about 1:2.0 with respect to that of the lower trench.

In some examples, the present disclosure describes a method of manufacturing an element isolation layer structure for a semiconductor device, and the method includes forming an upper trench and a lower trench at an upper portion of a substrate, the upper and the lower trenches in communication with each other and each having an inclined sidewall, forming a first thin film liner conformally along the upper trench and the lower trench to have a uniform thickness, forming a second thin film liner pattern selectively on a lower portion of the first thin film liner, the lower portion being located on both a bottom and a sidewall of the lower trench, the second thin film liner pattern having a uniform thickness to alleviate stress which occurs in a lower corner area of the lower trench, filling the lower trench on the second liner pattern to form a lower isolation layer in the lower trench and filling the upper trench on the lower isolation layer to form an upper isolation layer connected with the lower isolation layer.

In some examples, prior to forming the second thin film pattern, a sacrificial pad may be further formed on an upper portion of the first thin film and between a plurality of upper trenches adjacent to each other.

In some examples, the sacrificial pad may be formed using a material having an etch selectivity against the upper and the lower isolation layers. In some examples, a wet etch process may be performed against the sacrificial pad to remove the sacrificial pad from the upper portion of the first thin film liner.

In an example embodiment, forming the lower isolation layer and the second thin film liner pattern may include forming a second thin film liner conformally on the first thin film liner formed on the upper trench and the lower trench, and on the sacrificial pad, performing a first gap-filling process to fill the lower trench to form a preliminary lower isolation layer on the second thin film liner, performing an isotropic etching process against the preliminary lower isolation layer to form the lower isolation layer selectively in the lower trench and performing an isotropic etching process against the second thin film liner to form the second thin film liner pattern selectively in the lower trench.

In some examples, forming the upper isolation layer may include performing a second gap-filling process to fill the upper trench to form a preliminary upper isolation layer, densifying the preliminary upper isolation layer, removing a residual portion of the preliminary upper isolation layer that remains on the sacrificial pad, and lifting off the sacrificial pad from the substrate.

In some examples, the first thin film liner includes an oxide, and the second thin film liner pattern includes a nitride. For example, the first thin film liner includes amino acid oxide, and the second thin film liner pattern includes amino acid nitride.

In some examples, the upper trench has a vertical depth ratio in a range from about 1:0.5 to about 1:2.0 with respect to that of the lower trench.

As described above, the element isolation layer structure may include the second thin film liner pattern interposed between the first thin film liner and the lower isolation layer and formed in the lower trench. Thus, the element isolation layer structure may help relieve the thermal stress generated in the lower corner area of the lower trench. As a result, separation in the lower corner area may be inhibited to improve the element isolation characteristics.

In some examples, since only the first thin film liner is formed on the upper trench and not the second thin film liner pattern, the element isolation layer structure may include a profile of the upper corner area substantially identical to that of an upper corner area formed by a conventional element isolation layer structure that includes only a first thin film liner without a second thin film liner pattern. Accordingly, when devices are formed on the upper surface of the substrate and included in the element isolation layer structure, the devices may have properties same as those of the devices formed in a conventional element isolation layer structure.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

The semiconductor devices and techniques for forming such devices described herein may be used to electrically isolate such semiconductor elements in a high aspect ratio devices while also addressing one or more of the challenges described above.

Example devices of the present disclosure and methods of forming the same are described in more detail with reference to the accompanying drawings. The present invention may, however, be embodied in different forms or using different methods other than those shown by the figures and should not be construed as limited to the only the embodiments set forth herein.

In the specification, when one component is referred to as being on or connected to another component or layer, it can be directly on or connected to the other component or layer, or an intervening component or layer may also be present. Contrarily, it will be understood that when one component is referred to as directly being on or directly connected to another component or layer, it means that no intervening component is present. When a layer, a film, a region, or a plate is referred to as being 'on' another one, it can be directly on the other one, or one or more intervening layers, films, regions, or plates may also be present. Unlike this, it will also be understood that when a layer, a film, a region, or a plate is referred to as being 'directly on' another one, it is directly on the other one, and one or more intervening layers, films, regions, or plates do not exist.

As used herein, the terms first, second, third, and the like are used to describe various components, compositions, regions, and layers in various examples of the present invention in order to help distinguish one component from another and are not intended to limit these terms to a specific quantity or arrangement.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are to be expected. Accordingly, embodiments of the present invention are not described as being limited to specific shapes of areas shown within the diagrams and may include deviations in the shapes or other shapes unless otherwise described. Further, the areas shown within the drawings are entirely schematic and their shapes are not drawn to scale and not intended to limit the scope of the present invention unless otherwise described.

Figure 1:
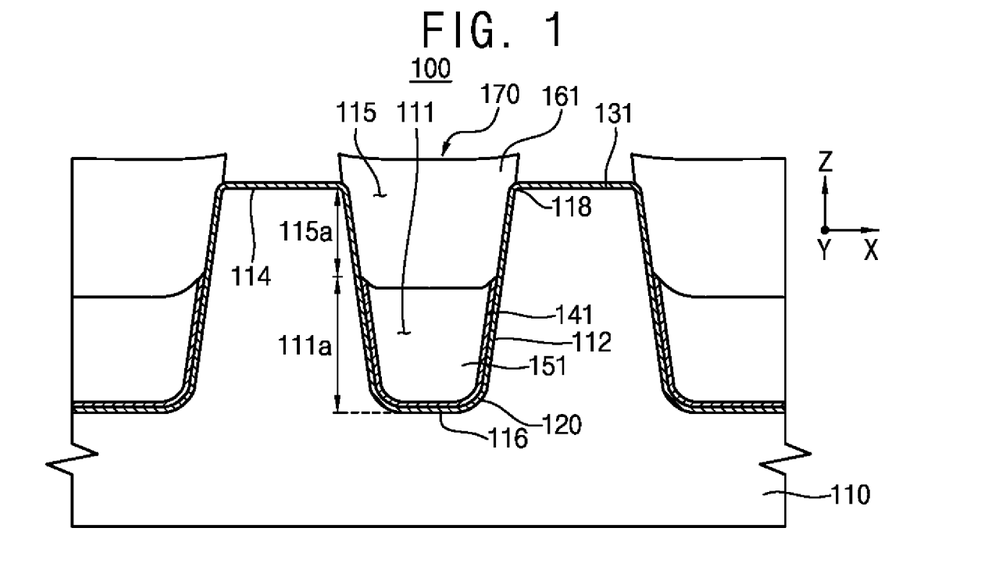
FIG. 1 is a cross sectional view illustrating a semiconductor device that includes an element isolation layer structure in accordance with the present disclosure.

FIG. 1 is a cross sectional view illustrating an element isolation layer structure 100 of a semiconductor device in accordance with the present disclosure. Referring to FIG. 1, the element isolation layer structure 100 includes a substrate 110, a first thin film liner 131, a second thin film liner pattern 141, and an element isolation layer 170 including a lower isolation layer 151 and an upper isolation layer 161. The element isolation layer structure 100 may be applied to a high-voltage CMOS device, a high-voltage diode, or the like. The element isolation layer structure 100 may partition an active region and a field region from each other or electrically isolate the elements of the device from each other.

The substrate 110 may be a silicon substrate or a silicon-on-insulator (SOI) substrate. Devices such as diodes, transistors, and the like may be formed on the substrate 110.

The substrate 110 includes one or more trenches defined by the substrate 110 with each trench including an upper trench 115 and a lower trench 111 that are in communication (e.g., electrical communication) with each other. Each of the upper trench 115 and the lower trench 111 may be defined by an inclined sidewall 112 of the substrate 110 that forms the trench. For example, the upper trench 115 and the lower trench 111 may define a width that becomes wider in an upright direction (e.g., positive z-axis direction of FIG. 1). The upper trench 115 and the lower trench 111 may be formed through an etching process.

The upper and lower trenches 115 and 111 may be distinguished by the relative position of second thin film liner pattern 141. For example, the second thin film liner pattern 141 may be positioned within only the lower trench 111, whereas the upper trench 115 excludes the presence of the second thin film liner pattern 141.

The lower trench 111 may define a vertical depth 11a measured from a bottom surface 116 of the lower trench 111 (e.g., the valley of the trench) in a vertical direction (e.g., in the z-axis direction of FIG. 1 or perpendicular to a plane defined by substrate 110) to where the upper trench 115 begins. The upper trench 115 may define a vertical depth 115a measured from the upper end of the lower trench 111 to an upper surface 114 of the substrate 110 (e.g., the major surface of substrate 110 prior to formation of the trench) in the vertical direction (e.g., in the z-axis direction of FIG. 1 or perpendicular to a plane defined by substrate 110).

The upper trench 115 is defined by a portion of inclined sidewall 112 of substrate 110 which provides the shape of the trench. The area where the inclined sidewall 112 of the upper trench 115 and the upper surface portion 114 of the substrate 110 meet is defined as an upper corner area 118. The lower trench 111 is defined by a portion of inclined sidewall 112 and the bottom surface 116 of the substrate 110. An area where the inclined sidewall 112 of the lower trench 111 and the bottom surface 116 meet is defined as a lower corner area 120. In some examples, the upper corner area 118, the lower corner area 120, or both may have a rounded edge (e.g., a continuously curved intersection). Thus, an electric field concentration in the corner areas may be relieved more as compared with a conventional element isolation layer structure where the corner area has a sharp edge (e.g., two straight sides meeting at a defined angle).

Referring to FIG. 1, the first thin film liner 131 may have a substantially uniform (e.g., uniform or nearly uniform) thickness that covers both the sidewall 112 of the upper trench 115, and the sidewall 112 and the bottom surface 116 of the lower trench 111. In some examples, the first thin film liner 131 may conform to the shape of substrate 110 and cover the trench entirely, e.g., cover the entire bottom surface 116 and the sidewall 112.

The first thin film liner 131 may help suppress trapped charges which may otherwise occur at an interface between the sidewalls 112 of the upper and lower trenches 115 and 111 and the element isolation layer 170. Further, the first thin film liner 131 may help smooth the upper and lower corner areas 118 and 120 to help form a rounded profile, respectively.

The first thin film liner 131 may include an oxide such as silicon oxide. Accordingly, the first thin film liner 131 may have an excellent etch selectivity with respect to the substrate 110 and the second thin film liner pattern 141. Therefore, in a subsequent etching process for forming the second thin film liner pattern 141, the first thin film liner 131 may resist etching to remain due to the etching selectivity against the second thin film liner pattern 141.

In particular, the first thin film liner 131 may be formed using an amino acid oxide. Additionally, or alternatively, the first thin film liner 131 may be formed to have a uniform surface finish using a chemical mechanical polishing process using, for example, a slurry such as cerium oxide.

The second thin film liner pattern 141 is selectively provided on bottom surface 116 and a lower portion of sidewall 112 on the first thin film liner 131. That is, the second thin film liner pattern 141 may be selectively provided indirectly on the sidewall 112 and the bottom surface 116 of the lower trench 111 on first thin film liner 131, but is not formed on an upper portion of sidewall 112 and the first thin film liner 131 within upper trench 115. Thus, it is only the first thin film liner 131 not the second thin film liner pattern 141 that is formed on the sidewall 112 of the upper trench 115, so that the profile of the upper corner area 118 (e.g., the area which connects the top of the sidewall 112 of the upper trench 115 and the upper surface 114 of the substrate 110) may be the same as that of a corner area of a conventional element isolation layer structure. Accordingly, when devices are formed on the upper surface portion of the substrate 110 and included in the element isolation layer structure 100 according to the examples of the present disclosure, the devices have the same characteristics as the devices formed on the conventional element isolation layer structure.

The second thin film liner pattern 141 is formed to have a substantially uniform (e.g., uniform or nearly uniform) thickness. Therefore, the second thin film liner pattern 141 may alleviate the thermal stress, which may otherwise occur in the lower corner area 120 within the lower trench 111.

The second thin film liner pattern 141 may be formed of a nitride-based material such as nitride or oxynitride. For example, the second thin film liner pattern 141 may include an amino acid nitride. Thus, when the second thin film liner pattern 141 is formed by patterning the second thin film liner 140 (see FIG. 2) through an etching process and a chemical mechanical polishing process, the chemical mechanical polishing process may be performed using a slurry such as cerium oxide to polish the second thin film liner 140 uniformly.

Referring again to FIG. 1, the lower isolation layer 151 is formed on the second thin film liner pattern 141 to substantially fill (e.g., fill or nearly fill) the lower trench 111. The lower isolation layer 151 selectively fills the lower trench 111, such that when the aspect ratio of the trench is relatively large, the lower isolation layer 151 may fill the lower trench 111 without voids.

The lower isolation layer 151 may include an oxide. For example, the lower isolation layer 151 may include a high-density plasma oxide (HDP oxide). Thus, the lower isolation layer 151 may fill the lower trench 111 without voids.

The upper isolation layer 161 is formed on the upper portion of sidewall 112 of the first thin film liner 131 and the lower isolation layer 151 to substantially fill (e.g., fill or nearly fill) the upper trench 115. The upper isolation layer 161 is connected to (e.g., directly on) the lower isolation layer 151 to form the element isolation layer 170 including the upper and the lower isolation layers 161 and 151.

The upper isolation layer 161 may include an oxide. For example, the upper isolation layer 161 may include a high-density plasma oxide (HDP oxide). Thus, the upper isolation layer 161 may fill the upper trench 115 without voids.

In some examples, the upper trench 115 may have the upper vertical depth 115a ranging from about 1:0.5 to about 1:2.0 with respect to the lower vertical depth 111a of the lower trench 111 (e.g., referred to as the vertical depth ratio). When the upper trench 115 has the upper vertical depth 115a less than 1:0.5 with respect to the lower vertical depth 111a, the second thin film liner pattern 141 may be too high. Therefore, when an element is formed on the upper surface potion of the substrate 110 and included in the element isolation structure 100, the device may not have characteristics identical to those of the device formed on the conventional element isolation layer structure. On the other hand, when the upper trench 115 has the upper vertical depth 115a greater than 1:2 with respect to the lower vertical depth 111a, the second thin film liner pattern 141 may not effectively relieve the thermal stress, which may occur at the lower corner area 120 of the lower trench 111.

FIGS. 2 to 6 are cross sectional views illustrating example intermediate structures formed during a method of manufacturing an element isolation layer structure 100 of FIG. 1 according to an example embodiment of the present invention. FIGS. 2 to 6 are described further with respect to the method techniques discussed below.

Figure 2:
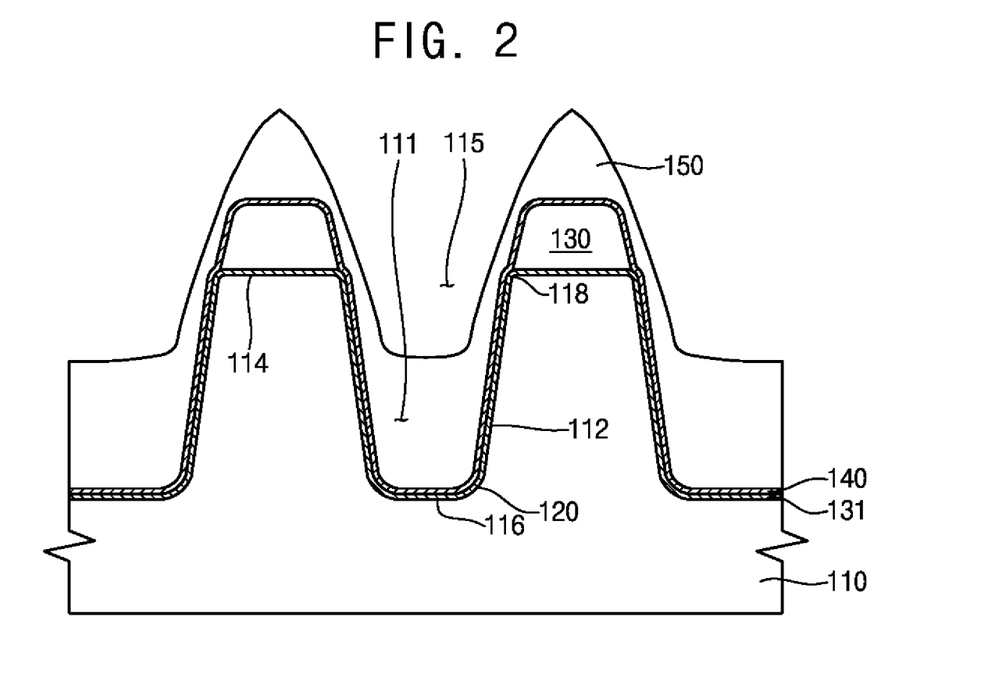
FIGS. 2 to 6 are cross sectional views illustrating example intermediate structures formed during a method that may be used to form the element isolation layer structure of FIG. 1.

Referring to FIG. 2, a pad oxide thin film (not shown) and a pad nitride thin film (not shown) may be sequentially formed on a substrate 110, and then the pad oxide thin film and the pad nitride thin film may be patterned by an etching process, thereby forming an inclined profile type trench. The trench may be divided into an upper trench 111 and a lower trench 115 based on the relative position of the second thin film liner pattern 141 (see FIG. 3) which is subsequently formed and described further below.

The etching process may include a photolithographic etching process. For example, a photoresist layer pattern (not shown) is formed on the pad nitride thin film, and then the pad nitride thin film and the pad oxide thin film are etched using the photoresist layer pattern as an etching mask to form a hard mask pattern including a pad oxide thin film pattern and a pad nitride thin film pattern on the substrate 110. After removing the photoresist pattern, an upper surface portion of the substrate 110 is etched using the mask pattern as an etch mask to form the trenches within the upper surface (e.g., upper surface 114) of the substrate 110.

Since the pad oxide thin film is interposed between the substrate and the pad nitride thin film, the pad oxide thin film buffers stress which may occur in a deposition and thermal processes for forming the pad nitride thin film, which may affect the substrate 110.

In some examples, a rounding process such as a hydrogen-annealing process may be additionally performed to substrate 110. In some such examples, the hydrogen-annealing process may be performed at a temperature in a range of 800° C. to 1,000° C. for a process time of about 30 to 180 seconds to round the lower corner areas 120 and the upper corner areas 118 of a respective trench. In the rounding process in the hydrogen atmosphere, a crystalline lattice of a portion of the substrate 110 adjacent to the trench may be changed into a new crystalline structure according to the movement of the silicon atoms.

Next, a first thin film liner 131 can be conformally formed along the upper trench 115 and the lower trench 111 having an overall uniform thickness. For example, the first thin film liner 131 may be formed on the inner sidewall 112 and the bottom surface 116 of the trench through a thermal oxidation process. The first thin film liner 131 may be formed to have a thickness of about 10 to 100 Å.

A thermal oxidation process may be performed in an oxygen atmosphere at a temperature in a range of about 900 to 1,100° C. to form the first thin film liner 131 on the inner sidewall 112 and the bottom surface 116 of the trench. Alternatively, the first thin film liner 131 may be formed through a dry or wet oxidation process using O2 gas or H2O gas as a source.

The first thin film liner 131 may help suppress trapped charges (interface trapped charges) from occurring at an interface between a portion of the substrate corresponding to the sidewall 112 of the trench and an element isolation layer 170 that is subsequently formed, and may help further round profiles of the upper corner areas 118 and the lower corner areas 120.

Next, a second thin film liner pattern 141 having a uniform thickness may be selectively formed on a lower portion of the first thin film liner 131 on the parts of the sidewall 112 and a bottom surface 116 of the lower trench 111. The second thin film liner pattern 141 may relieve thermal stress, which may otherwise occur at the lower corner areas 120 of the lower trench 111. In some examples, the second thin film liner pattern 141 may be formed to have a thickness of about 10 to 100 Å.

The second thin film liner pattern 141 may suppress thermal stress from being generated at the lower corner areas 120 of the lower trench 111. Furthermore, the second thin film liner pattern 141 may help inhibit degradation that may otherwise occur while one or more subsequent processes are performed to form the element isolation layer 170.

In some examples, a sacrificial pad 130 may be formed on an upper surface portion of the substrate 110 between and a plurality of trenches (e.g., areas around and separating the respective trenches), prior to forming the second thin film liner pattern 141. The sacrificial pad 130 is used as a stopper layer for subsequent chemical mechanical polishing (CMP) process. Further, the sacrificial pad 130 may be lifted off together with any residual portions formed thereon (e.g., residual portion 145 of second thin film liner 140) in a subsequent lift-off process. The sacrificial pad 130 may be formed to have a thickness of about 500 to about 1,000 Å.

The sacrificial pad 130 may be formed through an LPCVD process using a dichlorosilane (DCS) gas and an amine (NH3) gas as a source. Alternatively, the sacrificial pad 130 may be formed through a PECVD process using a silane or an amine gas as a source.

The sacrificial pad 130 may be formed using a material having an etch selectivity compared with the element isolation layer 170. That is, when the element isolation layer 170 is formed using an oxide, the sacrificial pad 130 may be formed using a nitride that may be preferentially etched over the element isolation layer 170.

In some examples, a lower isolation layer 151 and the second thin film liner pattern 141 may be formed by the following steps. First, a second thin film liner 140 (e.g., material used to form second thin film liner pattern 141) may be conformally formed on the first thin film liner 131 and the sacrificial pad 130. The second thin film liner 140 may be formed using, for example, a nitride.

Next, a first gap-filling process may be performed to fill the lower trench 111 to form the preliminary lower isolation layer 150 in the lower trench 111 and to cover the second thin film liner 140. At this time, the preliminary lower isolation layer 150 is also formed both over the sacrificial pad 130 and within the lower trench 111.

The preliminary lower isolation layer 150 may be formed through a high-density plasma oxidation process. Additionally, or alternatively, the preliminary lower isolation layer 150 may fill the lower trench 111 without voids.

Figure 3:
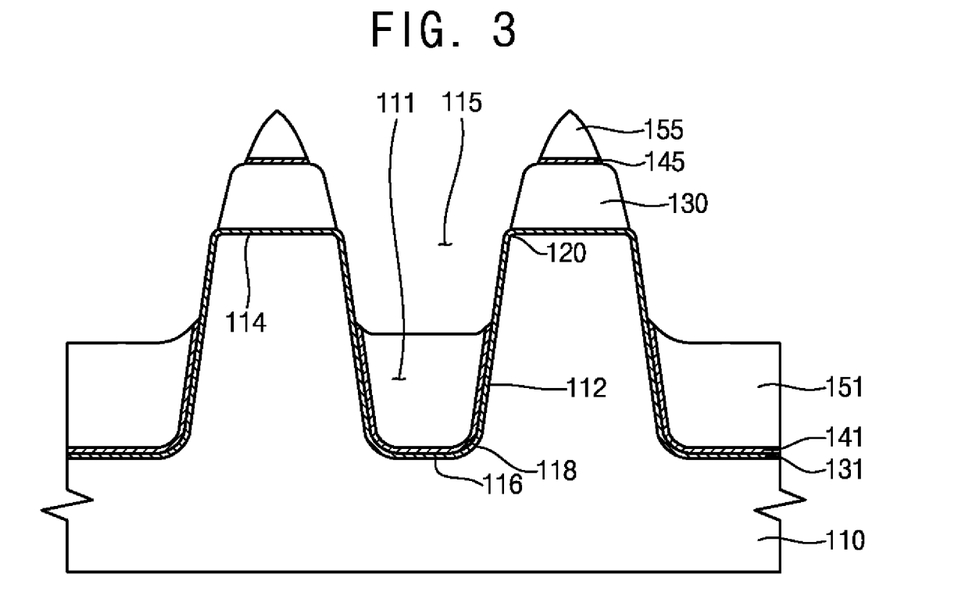

Referring to FIG. 3, an isotropic etching process may then be performed on the preliminary lower isolation layer 150 to selectively form the lower isolation layer 151 in the lower trench 111. In addition, in the upper trench 115, the preliminary lower isolation layer 150 is completely removed. In some examples, a residual portion 155 of the preliminary lower isolation layer 150 may remain on the sacrificial pad 130. An example of the isotropic etching process includes a wet etching process.

Subsequently, an isotropic etching process is further performed against the second thin film liner 140 to form the second thin film liner pattern 141 selectively in the each respective lower trench 111. At this time, any upper portions of the second thin film liner 140 located on the sidewall 112 within the upper trench 115 is completely removed (see FIG. 3).

Figure 4:
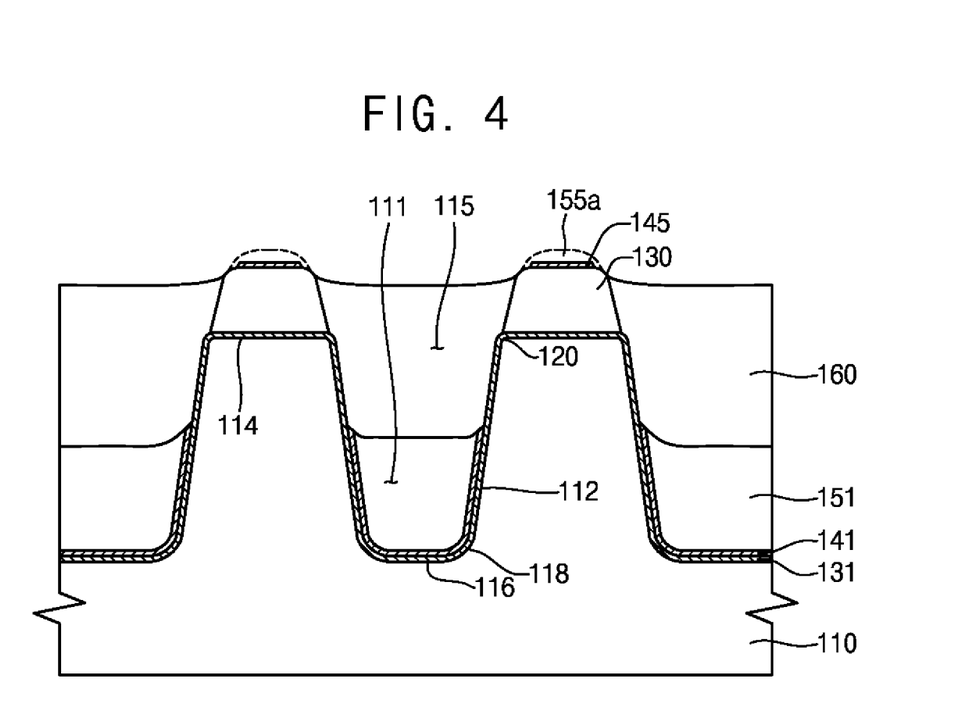

Referring to FIG. 4, an upper isolation layer 161 is formed to substantially fill the upper trench 115. For example, a second gap-filling process may be performed to fill the upper trench 115. Thus, a preliminary upper isolation layer 160 is formed to fill the upper trench 115. The second gap filling process may include a high density plasma oxidation process. Next, the preliminary upper isolation layer 160 may be heat-treated to densify a structure of the preliminary upper isolation layer 160.

Figure 5:
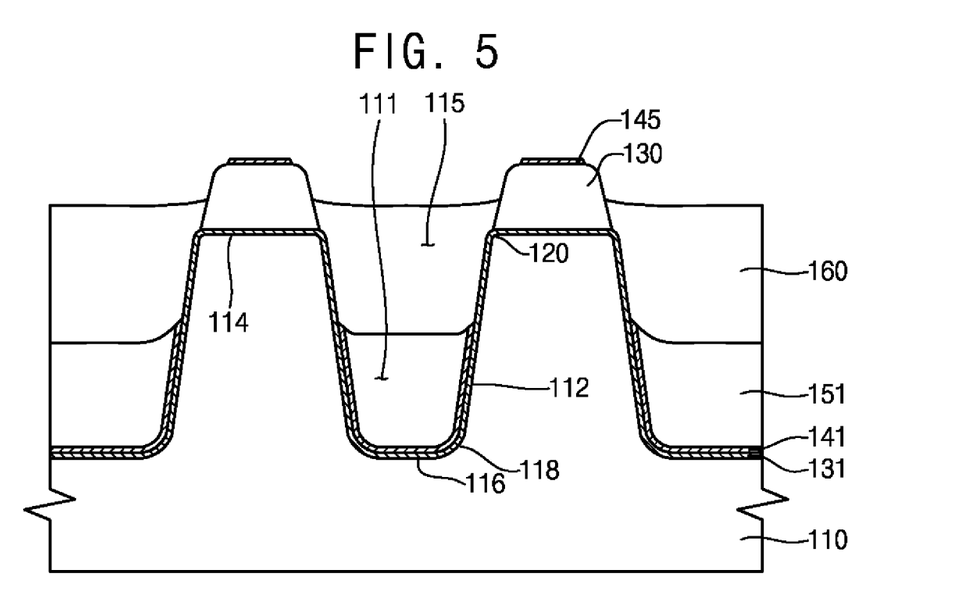

Subsequently, the residual portion 155a remaining on the sacrificial pad 130 may be removed. In order to remove the residual portion 155a from the sacrificial pad 130, a chemical mechanical polishing process may be performed. At this time, the sacrificial pad 130 may function as a polishing stopper. The chemical mechanical polishing process may be performed using a cerium oxide as a slurry. At this time, if the second thin film liner pattern 141 is made of an amino acid oxide, residual amounts of the residual portion 155a which remain on the sacrificial pad 130 may be reduced. Referring to FIG. 5, if the residual portion 155a remains on the sacrificial pad 130, the residual portion 155a may be etched to completely remove the residual portion 155a from the sacrificial pad 130.

Figure 6:
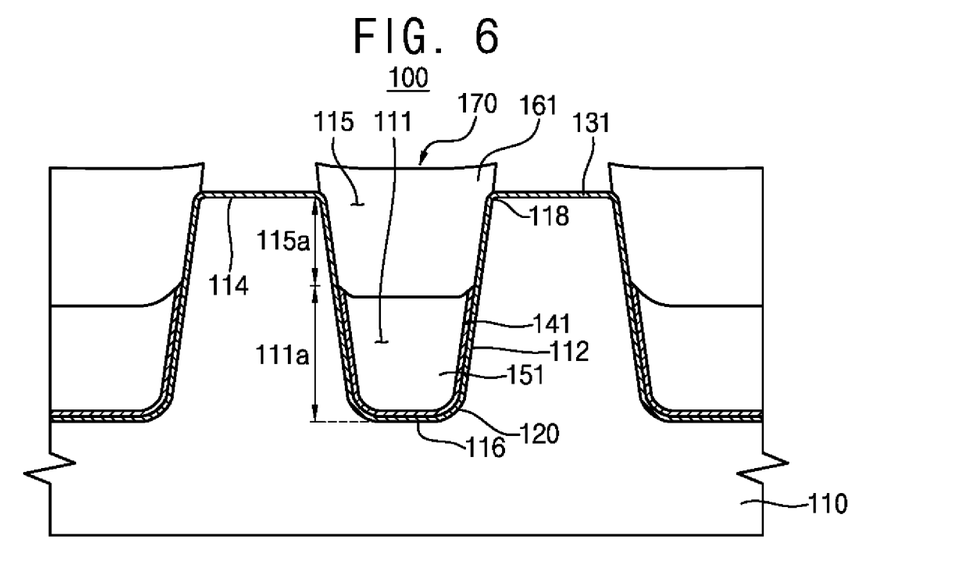

Referring to FIG. 6, the sacrificial pad 130 is lifted-off and removed from the upper surface portion of the substrate 110. Thus, a lower isolation layer 151 and an upper isolation layer 161 are formed in the lower trench 111 and the upper trench 115, respectively to form an element isolation layer 170.

The element isolation layer structure 100 according to embodiments of the present invention can be applied to a high voltage CMOS device, a high voltage diode, and the like. The element isolation layer structure 100 may partition the active region and the field region or electrically isolate portions of the device.

Although the element isolation layer structure 100 and the method of manufacturing the element isolation layer structure have been described with reference to the devices of FIGS. 1 to 6, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

What is claimed is:

1. An element isolation layer structure comprising:
 a substrate defining a trench comprising an upper trench and a lower trench in communication with each other, the substrate comprising an inclined sidewall that forms the upper trench and the lower trench;
 a first thin film liner on the substrate and conforming to a shape of the substrate, the first thin film liner comprising a substantially uniform thickness along the upper trench and the lower trench;
 a second thin film liner pattern selectively formed on a lower portion of the first thin film liner within a volume defined by the lower trench, the second thin film liner pattern comprising a substantially uniform thickness;
 a lower isolation layer formed directly on the second thin film liner pattern, the lower isolation layer substantially filling the volume defined by the lower trench; and an upper isolation layer formed on an upper portion of the first thin film liner and the lower isolation layer, the upper isolation layer substantially filling a volume defined by the upper trench,
wherein the first thin film liner comprises amino acid oxide, and the second thin film liner pattern comprises amino acid nitride.

2. The element isolation structure of claim 1, wherein the second thin film liner pattern is configured to reduce thermal stress that occurs in a lower corner area between the inclined sidewall and a bottom surface of the lower trench.

3. The element isolation layer structure of claim 1, wherein the upper trench and the lower trench define a vertical depth ratio of about 1:0.5 to about 1:2.

4. The element isolation layer structure of claim 1, wherein the substrate defines a plurality of trenches including the trench, a plurality of lower isolation layers including the lower isolation layer, and plurality of upper isolation layers including the upper isolation layer,
wherein each respective trench of the plurality of trenches comprises:
a respective upper trench and a respective lower trench in communication with each other;
a respective portion of the first thin film liner that conforms to a shape of each respective trench;
a respective portion of the second thin film liner pattern that is selectively on the first thin film liner within a volume defined by each respective lower trench;
a respective lower isolation layer of the plurality of lower isolation layers formed on the respective portion of the second thin film liner pattern and substantially filling the volume defined by the respective lower trench; and
a respective upper isolation layer of the plurality of upper isolation layers formed on the respective portion of the first thin film liner and the respective lower isolation layer and substantially filling a volume defined by the respective upper trench.

* * * * *